United States Patent [19]

McCarthy

[11] Patent Number: 5,395,481
[45] Date of Patent: Mar. 7, 1995

[54] METHOD FOR FORMING SILICON ON A GLASS SUBSTRATE

[75] Inventor: Anthony M. McCarthy, Menlo Park, Calif.

[73] Assignee: Regents of the University of California, Oakland, Calif.

[21] Appl. No.: 137,401

[22] Filed: Oct. 18, 1993

[51] Int. Cl.[6] .......................................... H01L 21/306
[52] U.S. Cl. ..................... 156/630; 437/62; 437/974; 148/DIG. 12; 148/DIG. 150
[58] Field of Search ............... 156/630; 437/62, 974, 437/26; 148/DIG. 12, DIG. 150

[56] References Cited

U.S. PATENT DOCUMENTS

| | | | |
|---|---|---|---|
| 3,332,137 | 7/1967 | Kenney | 29/423 |
| 3,902,979 | 9/1975 | Thomas | 204/129.3 |
| 3,959,045 | 5/1976 | Antypas | 156/3 |
| 4,599,792 | 7/1986 | Cade et al. | 148/DIG. 50 |
| 4,601,779 | 7/1986 | Abernathey et al. | 156/628 |
| 4,875,086 | 10/1989 | Malhi et al. | 357/54 |
| 5,013,681 | 5/1991 | Godbey et al. | 431/86 |
| 5,071,792 | 12/1991 | VanVonno et al. | 437/974 |
| 5,110,748 | 5/1992 | Sarna | 437/51 |
| 5,147,808 | 9/1992 | Pronko | 437/974 |

OTHER PUBLICATIONS

Hamaguchi et al., "Novel LSI/SOI Wafer Fabrication Using Device Layer Transfer Technique"; IEDM85; 1985, pp. 688–691.
R. A. Lemons et al., "Laser Crystallization On Si Films On Glass", Appl. Phys. Lett., vol. 40, pp. 469–471, 1982.
J. B. Laskey et al., "Silicon–on–Insulator (SOI) by Bonding and Etch-back", DIG. 1985 IEEE Int. Electron Devices Meeting, Dec. 1985, pp. 684–687.
L. J. Spangler et al., "A Technology For High-Performance Single-Crystal Silicon-on-Insulator Transistors", IEEE Elec. Device Lett., vol. EDL-8, No. 4, Apr. 1987, pp. 137–139.
T. W. Sigmon et al., "Nanosecond Thermal Processing For Ultra-High-Speed Device Technology", Mat. Res. Soc. Symp. Proc., vol. 158, 1990, pp. 241–253.
K. H. Weiner et al., "Low-Temperature Fabrication of p+-NDiodes with 300Å Junction Depth", IEEE Electron Device Letters, vol. 13, No. 7, Jul. 1992, pp. 369–371.

Primary Examiner—Brian E. Hearn
Assistant Examiner—Trung Dang
Attorney, Agent, or Firm—Henry P. Sartorio; L. E. Carnahan

[57] ABSTRACT

A method by which single-crystal silicon microelectronics may be fabricated on glass substrates at unconventionally low temperatures. This is achieved by fabricating a thin film of silicon on glass and subsequently forming the doped components by a short wavelength (excimer) laser doping procedure and conventional patterning techniques. This method may include introducing a heavily boron doped etch stop layer on a silicon wafer using an excimer laser, which permits good control of the etch stop layer removal process. This method additionally includes dramatically reducing the remaining surface roughness of the silicon thin films after etching in the fabrication of silicon on insulator wafers by scanning an excimer laser across the surface of the silicon thin film causing surface melting, whereby the surface tension of the melt causes smoothing of the surface during recrystallization. Applications for this method include those requiring a transparent or insulating substrate, such as display manufacturing. Other applications include sensors, actuators, optoelectronics, radiation hard and high temperature electronics.

27 Claims, 3 Drawing Sheets

METHOD FOR FORMING SILICON ON A GLASS SUBSTRATE

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to a method for forming a thin silicon layer on an insulator, particularly to such a method which introduces a boron doped etch stop for controlling removal of the silicon, and more particularly to such a method, using a short wavelength laser for performing laser assisted doping and activation, and which includes reducing the remaining surface roughness of the silicon thin film and/or etch back during the fabrication of the thin film of silicon on glass.

There has long been a desire to perform single-crystal silicon (SCS) processing with glass substrates to achieve single-crystal silicon (SCS) transistors on glass or other insulators.

Silicon-on-insulator (SOI) technologies have advanced dramatically in recent years toward the goal of producing thin silicon films on insulating substrates, such as glass or oxidized silicon. Components, such as transistors, fabricated in SOI films have the potential for increased mobility, reduced parasitic capacitance and leakage current as well as improved radiation hardness due to reduced junction sidewall area and elimination of bottom junction area. To date, there has been no success in achieving single-crystal silicon device fabrication on less expensive glass substrates incapable of withstanding temperatures more than 600° C. Others have achieved this with expensive glasses, such as Corning 1729 using 800° C. and Corning 1733 at 600° C. with compromises. SOI transistors on glass substrates are particularly attractive for sensors and displays, although many other applications are possible, such as actuators, high temperature electronics, optoelectronics, and radiation hard electrons.

A wide variety of techniques have been proposed for realizing thin amorphous silicon and polysilicon films compatible with high-performance devices on an insulating substrate. One prior approach involved crystallization of deposited polysilicon films using thermal energy derived from incident beams. See R. A. Lemons et al., "Laser Crystallization of Si Films on Glass", Appl. Phys. Lett., Vol. 40, pp. 469–471, 1982. This approach has met with some success, but device performance is still limited by problems associated with silicon crystal quality. Device properties in polysilicon or in amorphous silicon films are generally still less favorable. Another prior approach involved a process for producing silicon films on oxidized silicon and involves bonding two oxidized wafers together at high temperature and then thinning one wafer to produce a silicon-on-oxidized-silicon film. See J. B. Laskey et al., "Silicon-on-Insulator (SOI) by Bonding and Etch-back", Dig. 1985 IEEE Int. Electron Devices Mtng., December 1985, pp. 684–687. However, this process does not use a glass substrate which would make it useful for sensor/display applications, and voids during the bonding process are a concern. A more recent approach involved a process using electrostatic bonding of a silicon wafer to expensive glass, such as Corning 1729 glass, and the subsequent thinning of the wafer using doping-sensitive etchants to retain only the epitaxial layer. See L. J. Spangler, "A Technology for High-Performance Single-Crystal Silicon-on-Insulator Transistors", IEEE Electron Device Letters, Vol. EDL-8, No. 4, April 1987, pp. 137–139. This process was effective for fabricating high-performance transistors in single-crystal silicon on glass substrates and is potentially compatible with both bipolar and MOS structures. However, this process used an alkaline-earth aluminosilicate high-temperature glass substrate having an anneal point of 853° C. as the substrate, whereby relatively standard integrated circuit (IC) process involving a temperature of about 800° C. could be used to fabricate the transistors, without damage to the glass substrate. In addition, this process involved electrostatic bonding of the silicon wafer to the glass substrate, requiring application of a typical voltage of 900 V for about thirty (30) minutes and resulted in bonding voids due to surface irregularities. Furthermore, Corning no longer commercially manufactures glasses capable of withstanding temperatures in excess of 600° C.

While these prior approaches advanced the SOI technologies, there has been a need in this art for a process for forming thin film silicon electronic devices on less expensive glass substrates. One approach to achieving the thin silicon films necessary to achieve this approach is exemplified by U.S. Pat. No. 5,013,681 issued May 7, 1991 to D. J. Godbey et al. A solution to the above-mentioned problems is provided by the present invention which involves the use of a laser to irradiate the surface of the thin silicon layer in the presence of a suitable doping gas, of sufficient energy to melt the silicon surface causing gas adsorption and dissociation on the surface of, and dopant incorporation through liquid phase diffusion in, the melt. Thus, this prior need in the art is satisfied by the present invention whereby a thin film of silicon is fabricated on a glass substrate and subsequently doped with electrically active species without damage to the glass. The method involves the use of a glass substrate as the handle wafer for a thin single-crystal device quality silicon layer, with the silicon substrate prepared with etch stop layers and an epitaxial thin film of device quality single-crystal silicon, with the two substrates being bonded anodically, whereafter the silicon substrate is etched away and the extra layers are removed, leaving a thin film of device quality single-crystal silicon on the glass substrate. The method may additionally involve using an excimer laser for forming one or more boron doped etch stops and reducing the surface roughness of the thin films in combination with the etching procedures.

SUMMARY OF THE INVENTION

It is an object of the present invention to provide a silicon-on-insulator (SOI) process involving the formation of thin silicon films on an insulating substrate.

A further object of the invention is to provide a method for forming thin films of silicon on a glass substrate.

A further object of the invention is to provide a technique for processing thin films of silicon on glass to permit fabrication of SCS devices on glass.

A further object of the invention is to provide a silicon-on-insulator process using a short wavelength (excimer) laser for producing a doped etch stop in the silicon.

A further object of the invention is to provide a laser assisted process for dopant introduction and activation in a silicon-on-insulator process involving the formation of thin silicon films on an insulating substrate.

A further object of the invention is to provide a silicon-on-insulator process using an excimer laser for reducing surface roughness of the various films formed during the process.

Another object of the invention is to form a thin film of silicon on a glass substrate using one or more etch stops and epitaxial thin films of silicon formed on a silicon wafer, and whereafter the silicon wafer is bonded anodically to a glass substrate, and the silicon wafer and extra layers are removed leaving a single-crystal thin film of silicon on the glass substrate.

Another object of the invention is to form at boron doped etch stop on a silicon wafer using an excimer laser.

Another object of the invention is to reduce the surface roughness of silicon thin films using an excimer laser.

Another object of the invention is to provide a technique for surface smoothing of thin films of silicon on glass.

Other objects and advantages of the present invention will become apparent from the following description and the accompanying drawings. The invention is a method for forming a thin layer of silicon on an insulator, such as a glass substrate using at least one etch stop layer, whereafter active devices are formed on the silicon layer by short wavelength (excimer) laser doping using conventional patterning techniques. The method of this invention may be carried out by the introduction of at least one boron doped etch stop in a silicon wafer using a short wavelength (excimer) laser which is scanned over the surface of the silicon wafer in a boron doping atmosphere whereby the boron is adsorbed on the silicon surface and incorporated during surface melting. The method may also be carried out by reducing the surface roughness of the thin film of silicon by scanning an excimer laser across the surface causing surface melting whereby the surface tension of the melt forces smoothing of the surface during recrystallization. It is thus seen that the single-crystal silicon on insulator (SCS) produced b) this invention involves combining SOI technology with excimer laser silicon processing. The present invention combines the key features of dopant placement, electrical activation, and minimization of damage to the glass surface, which permits the fabrication of SCS devices on glass. The invention has particular application in fields requiring a transparent or insulating substrate, such as in display manufacturing, sensors, actuators, optoelectronics, radiation hard electronics, and high temperature electronics.

BRIEF DESCRIPTION OF THE DRAWINGS

The accompanying drawings, which are incorporated into and form apart of the disclosure, illustrate embodiments of the invention and, together with the description, serve to explain the principles of the invention.

DETAILED DESCRIPTION OF THE INVENTION

The present invention is carried out using a short wavelength laser to melt the surface of the silicon in the presence of a dopant gas, causing simultaneous gas adsorption and dissociation on the surface of, and dopant incorporation through liquid phase diffusion in, the melt. The advantage of this process is that it is completed in several microseconds and simultaneously achieves dopant placement and electrical activation. This is important to prevent damage to the glass surface which cannot bear excess temperatures for long periods. Furnace processing may not be used to activate implanted dopant on the silicon films on glass, since such typically requires 30 minutes, nine orders of magnitude more time, and temperatures in excess of 800° C., causing damage to the glass. Thus, the method of this invention combines the key features of dopant placement, electrical activation, and minimization of damage to the glass surface. This permits the fabrication of single-crystal silicon (SCS) devices on glass since all of the subsequent processing may be achieved using temperatures less than 600° C. Alternative approaches for introducing the dopant may also be used, such as implantation or gas decomposition by thermal or photolytic means followed by laser melting and dopant activation.

More specifically, the invention uses a glass wafer as the handle wafer for crystalline silicon-on-insulator (SOI) technology. The present invention involves an SOI method which is achieved by fabricating a thin film of silicon on glass, whereafter active devices may be formed on the silicon layer. The method is carried out so as to not have adverse effect on the glass substrate, and thus can be used in applications requiring a transparent or insulating substrate, such as in display manufacturing.

As will be understood more fully from the following detailed description of the invention, the method includes three (3) primary features or operations which can be utilized individually or consolidated. The first of these principle features is the formation of a thin layer of silicon on a glass substrate, which may include laser assisted doping and activation. The second feature is the use of a short wavelength (excimer) laser to form a doped etch stop. The third feature is the use of an excimer laser to reduce the surface roughness of the silicon thin films after the polish and/or etch back operations.

Figure 1A:
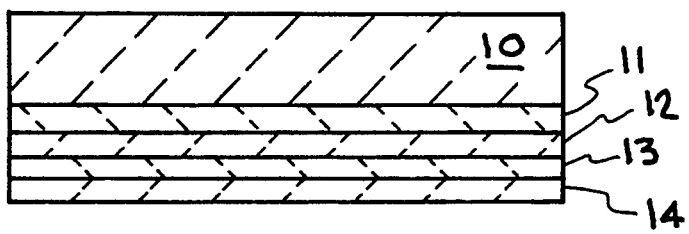
FIGS. 1A-1C illustrate an operational sequence for forming a thin silicon layer on a glass substrate in accordance with the present invention.
Figure 1B:
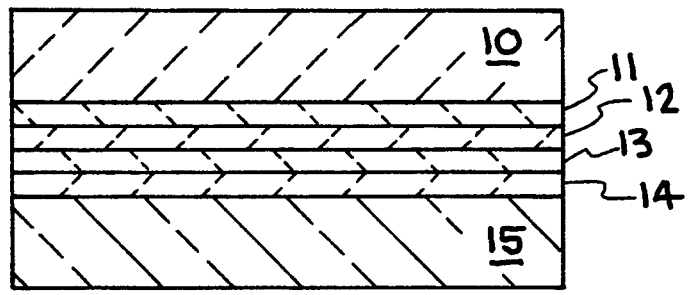
Figure 1C:
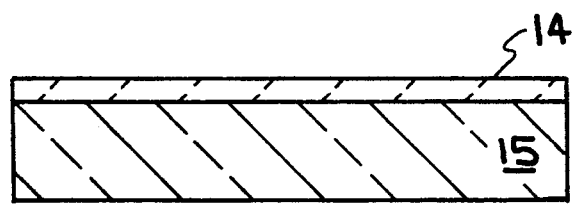

The preparatory phase of the first of the above-noted three primary features or operations of the method of this invention, and which can be utilized with or without the other two above-noted primary features is the formation of a thin film or layer of silicon on an insulator, such as glass, as illustrated in FIGS. 1A to 1C, and accomplished as follows:

A boron doped first etch stop, layer 11, is formed on a <100> silicon wafer 10, with boron level exceeding 5e18/cm$^3$-1e19/cm$^3$, as shown in FIG. 1A. Typical means of forming this layer are implantation, epitaxy or liquid source doping in a furnace at temperatures in excess of 750° C. The thickness of the layer is determined by the selectivity of the etching technique subsequently used to remove the silicon wafer. In this example a liquid source doped boron layer was used, about 3 microns thickness of which exceeded the required doping level. An intermediate silicon layer, 12, is epitaxially grown on the surface of layer 11. In this example the thickness of layer 12 was 1.5 microns. A suitable thickness of layer 12 exceeds 0.5 microns. A second etch stop layer 13, may be an epitaxially grown boron doped silicon layer or a silicon-germanium layer. If a boron doped layer is used the thickness required will exceed about 500 Å and the doping density will exceed about 5e19/cm$^3$. In the event a silicon-germanium (SiGe) epitaxial layer 13 is used, it should have a thickness of about 100–1500 Å. Boron doping may be used in the SiGe layer but is not necessary to achieve adequate etch stop properties. The SiGe layer may have between 1 and 50% Ge. An undoped thickness of about 500 Å is usually sufficient. In experimental efforts, 10–25% SiGe layers have been used. The second etch stop layer 13 may also be formed from epitaxially grown silicon-lead (SiPb) or silicon-tin (SiSn).

An epitaxial layer 14 of device quality silicon, thickness of 0.01–1 μm, is epitaxially grown on the etch stop layer 13 (see FIG. 1A) at a temperature in the range 600° C.–900° C., for example. A low doping concentration in the range 1e14/cm$^3$–1e16/cm$^3$ layer is preferred.

The thus prepared silicon wafer is bonded anodically to a glass wafer 15, as shown in FIG. 1B. The anodic bonding is carried out by cleaning the glass substrate and the prepared silicon wafer and placing them together in a heating environment at a temperature between 270°–800° C., while directing a voltage in the range of 100–5000 V across the two substrates, the glass being the cathode.

The silicon wafer substrate 10 is removed leaving the etch stop layer 11 exposed. This can be accomplished by polishing and/or wet/dry etching techniques. Polishing, using a diamond containing slurry, is used to grind down the silicon wafer to a thickness of 100–200 μm followed by a wet or dry etch to complete removal of the silicon wafer. A wet etch of a 3:1 H$_2$O/KOH was used at 80° C. in this example. Typical H$_2$O/KOH compositions consist of 1:1-5:1. The time period of wet etching in this example was 8 hours. If desired, for the final 30 μm of the silicon wafer etch, Isopropanol (ISO) may be added to the H$_2$O/KOH solution in excess of solubility to provide a very sensitive etch stop. For example, a solution of 2:6:1 KOH:H$_2$O:ISO at 60° C. may be used. The etch rate of lightly doped silicon in this solution is about 2500 Å/minute whereas the etch rate of heavily boron doped silicon is about 30 Å/minute.

The etch stop layer 11 is removed by wet or dry etching, leaving the silicon layer 12. In this example, The layer 11 is etched by plasma etching in a SF$_6$/C$_2$ClF$_5$ environment using a power content of about 0.25 Watts/cm$^2$ for about 25 minutes.

The intermediate layer 12 is removed using the same selective etch of 3:1 KOH with Isoproponal added above liquid solubility as mentioned above. The second etch stop layer 13 is removed with a 5:1:1 H$_2$O:H$_2$O$_2$:NH$_4$OH etchant when SiGe is used as the etch stop, while plasma etching as above followed by laser smoothing may be used in the case of a boron etch stop or a wet etch like 2:1 H$_2$O:NH$_4$OH.

Figure 1D:
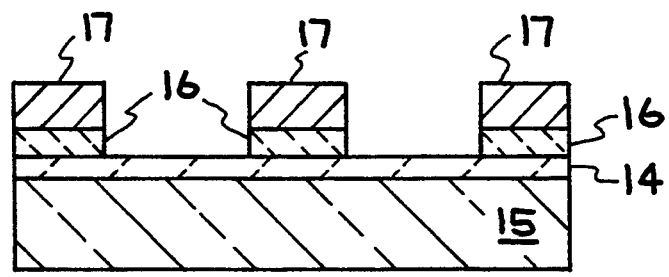
FIG. 1D illustrates a means through which the thin silicon layer of FIG. 1C may be masked prior to the laser assisted doping process.

At this point a thin film 14 of device quality silicon remains on the glass wafer or substrate 15, as shown in FIG. 1C. With the substrate material now formed, fabrication of the desired semiconductor devices in the silicon thin film may be performed. Since conventional furnace techniques to form the device would require temperatures which exceed the strain point of the glass, a short-wavelength (excimer) laser may be used to introduce and/or activate the desired dopants, which functions to melt and recrystallize silicon in patterned areas. Since the laser heats only the silicon film, the glass remains undamaged. In FIG. 1D, a low temperature oxide layer 16 and a high reflectivity metal layer 17 (such as aluminum), are deposited on the layer 14 on substrate 15. A pattern may be formed in the metal and oxide using standard lithographic and etching techniques to expose the surface of silicon layer 14, as seen in FIG. 1D. The metal layer 17 reflects the laser energy away from the surface in areas where doping is not desired.

Alternatively, the dopant may be introduced by masked implantation either for source and drains or for altering device bulk prioperties such as threshold implants. In this case the implants may be laser activated after removal of the masking layers. Laser activation prior to removal of the masking layers often results in poor junction edge electrical characteristics since the thermal effects of the laser radiation do not penetrate as fast as the implant straggle under the mask edge.

Figure 2A:
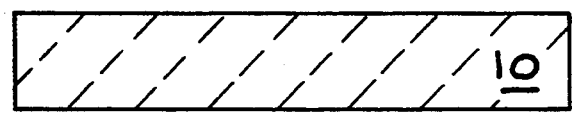
FIGS. 2A-2D illustrate an operational sequence of a process similar to that of FIGS. 1A-1D, but wherein the etch stop layers are formed using an excimer laser.

The etch stop layers 11 and 13 are conventionally formed by implantation or epitaxy. The second of the above-noted three primary features or operations of the method of this invention can be utilized to form the etch stop layers. The surface of silicon wafer 10, shown in FIG. 2A, is irradiated by a laser source with UV wavelength less than about 350 nm and with an energy intensity sufficient to melt the silicon surface. The power intensity required to melt silicon is 0.7J/cm$^2$. The excimer family of lasers include the XeF laser (wavelength of 193 nm) and the XeCl laser (wavelength of 308 nm), with a power intensity of 0.1–0.7 J/cm$^2$.

Figure 2B:
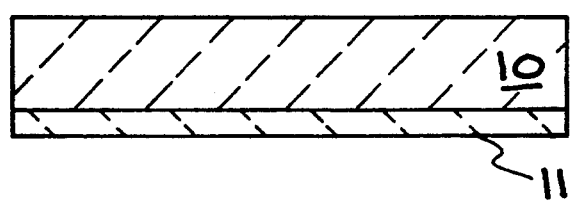
Figure 2C:
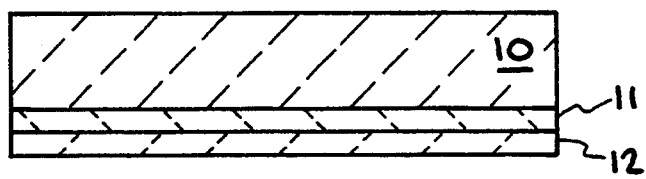
Figure 2D:
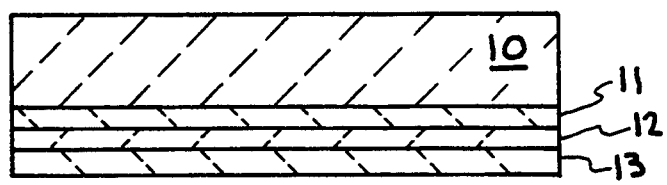

It is necessary to place the work piece (for example, the silicon wafer 10, or the silicon wafer 10 with layers 11 and 12, or the glass wafer 15 with layer 14 as shown in FIG. 1D) in an evacuated chamber in the presence of a suitable doping gas. The appropriate gases for silicon doping are typically the hydrides, fluorides, and chlorides containing the column III and V elements for silicon. In the presence of the doping gas the laser pulse melts the silicon and pyrolitically decomposes the surface adsorbed gas molecules causing dopant mixing in the melt. The melt depth can be controlled by altering the laser fluence and the substrate temperature. The melt is controlled to depths varying from 250–3000 Å and the surface concentration can be controlled to values >1e 20 cm$^{-3}$ using multiple doping pulses. The melting and recrystallization of this region traps the boron into electrically active substitutional lattice sites. This uniform thin sheet of heavily boron doped silicon acts as an excellent etch stop layer, indicated at 11 as shown in FIG. 2B, and permits good control of the etch stop layer removal process. One hundred percent activation of the incorporated dopant is achieved in the melted region. The melt time of the silicon is comparable to the laser pulse time. A boron doped etch stop may be introduced in the silicon surface as the first or subsequent etch stops. A second etch stop layer 13 introduced by the laser is shown prior to doping in FIG. 2C and after doping in FIG. 2D.

Figure 3A:
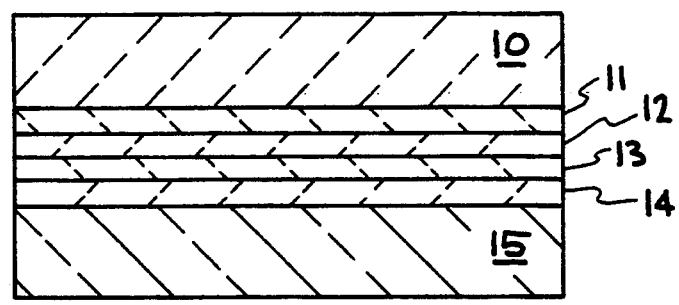
FIGS. 3A-3E illustrate an operational sequence of a process similar to that of FIGS. 2A-2D, but wherein the various surfaces are smoothed using an excimer laser.
Figure 3B:
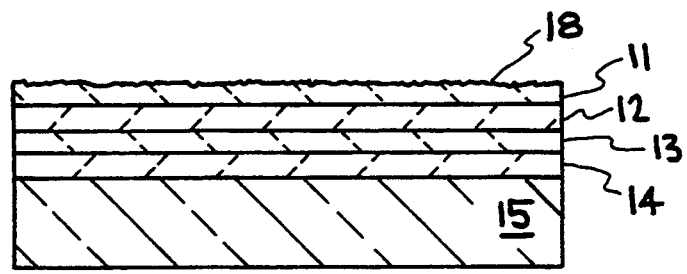
Figure 3C:
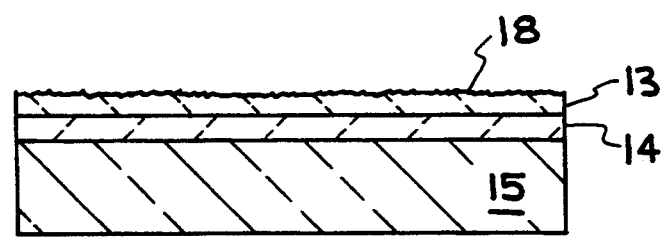
Figure 3D:
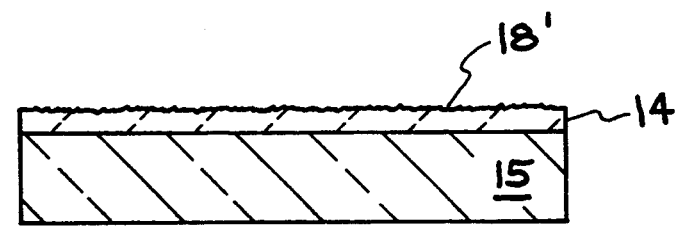
Figure 3E:
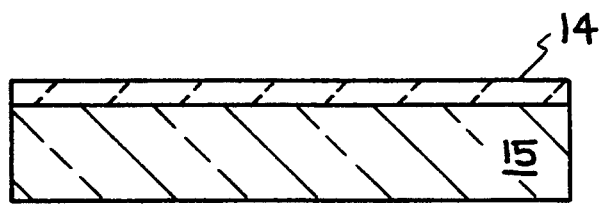

The third of the above-noted three primary features or operations of the method of this invention, and which can be utilized with either or both of the other two above-noted primary features, is for reducing remaining surface roughness. The surface roughness of surfaces after etching can be removed by using the excimer laser to melt the surface prior to subsequent etching, as shown in FIG. 3A, or prior to initiating the plasma etch as shown in FIG. 3B where surface roughness on layer 11, indicated at 18, occurs during the etch of layer 10 or on layer 13 as shown in FIG. 3C after etching of silicon layer 12. A similar treatment may be given to the surface of the silicon thin film 14 after removal of the extra layers, shown in FIG. 3D, where surface roughness, indicated at 18', may result from removing the final etch stop layer 13, and after laser smoothing results is a smooth surface of the thin film, as shown in FIG. 3E. This surface smoothing is produced by scanning the excimer laser over the surface causing melting of the surface material, whereby during recrystallization or solidification, the surface tension of the melt forces smoothing of the surface. The energy range of the excimer laser required will be in the range of 0.1 $J/cm^2 - 0.7 J/cm^2$ depending on the thickness of the thin film and the depth of the desired melt.

Figure 4A:
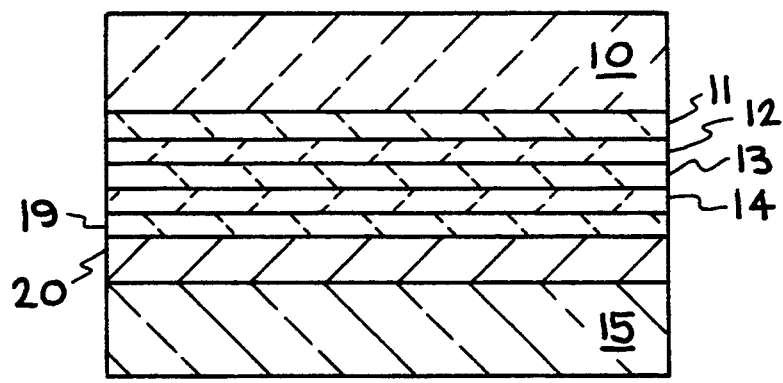
FIG. 4A illustrates a preferred embodiment of the various layers applied to a silicon wafer prior to bonding to a glass wafer.

FIG. 4A illustrates a processing method for a preferred embodiment of a silicon wafer assembly and bonding thereof to a glass wafer. The process for producing the coated silicon wafer, bending same to a glass wafer, and removing the silicon layers via the doped etch stops has already been described above. The additional feature is the incorporation of a dielectric layer 19 and a metal layer 20.

The dielectric layer or layers 19 are typically silicon nitride, silicon dioxide, or silicon oxynitrides deposited by plasma enhanced chemical vapor deposition at temperatures in the range of 100°–400° C. using gases such as the derivatives of silane to provide silicon, and ammonia to provide nitrogen and oxygen. The dielectric layers are usually slightly conductive due to the presence of as much as 1–25% hydrogen in the films. The principle purpose of these layers is to prevent diffusion of alkalis from the glass substrate into the silicon. Alkalis are well known to seriously degrade the performance of some semiconductor devices. The conductivity of these dielectric layers is sufficient to permit anodic bonding of the silicon wafer to the glass substrate. In this example a single thin layer of amorphous silicon nitride of a thickness of approximately 250 Å was used.

A second reason for using nitride films is their ability to selectively mask silicon etching in a potassium hydroxide (KOH) solution. The precise selectivity will vary depending on the KOH bath temperature (50°–80° C.), film and plasma deposition chemistry. For the silicon nitride films or layers used in the following example, a selectivity of approximately 2500:1 was measured.

The purpose of the metal layer 20 is to shield the regions where the devices will be from the influence of light impinging from the glass side of the structure. The metal layer 20 and the dielectric layer 19 are usually deposited on the glass substrate before bonding. The metals customarily used are refractory metals when the bonding temperature exceeds about 500° C. If the bonding temperature is less than about 500° C. then aluminum may also be used.

In the case that the metal layer is acting as more than just a light shield layer but also as a conductive layer then the sequence of deposited layers 19 and 20 on the silicon wafer is reversed and may be preceded by a low temperature oxide to isolate the metal from the silicon. In this oxide contact holes may be patterned to allow the metal to contact the silicon. In this example the dielectric layer 19 is bonded to the glass. An alternative bonding sequence which is commonly pursued is the deposition of layers 20 and 19 in that sequence on the glass and subsequent bonding of the glass with dielectric layer 19 to the silicon wafer surface.

Figure 4B:
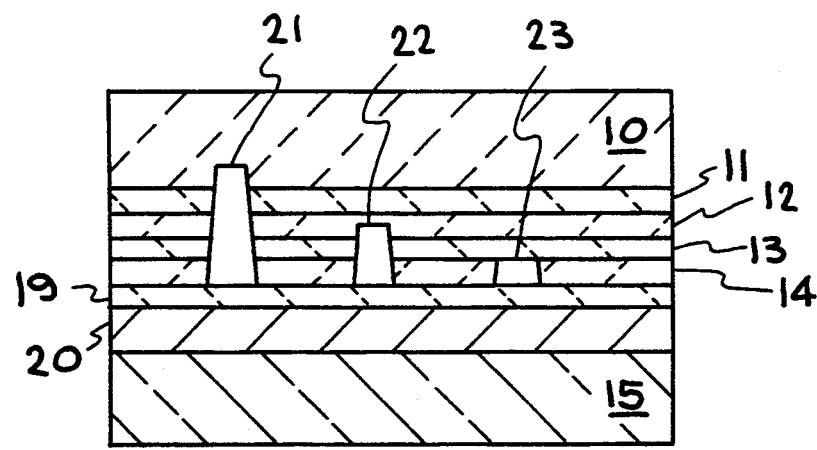
FIG. 4B illustrates a preferred embodiment of the various layers applied to a silicon wafer prior to bonding to a glass wafer which includes trenches etched for the purpose of etch end point detection.

It is often difficult to determine precisely the moment when the desired thickness of a silicon layer is remaining on the glass. Therefore, it is important that a convenient technique for determining end-point be established. This is performed by etching holes or trenches of varying thickness in the front surface of the silicon wafer prior to bonding as shown in FIG. 4B. In this Figure three trench depths are depicted at 21, 22 and 23. The deeper trench 21 has been etched through all the epitaxial layers 11, 12, 13, and 14, the intermediate depth trench 22 has been etched though layers 13 and 14, while the shallowest trench 23 has been etched through layer 14 only. After bonding the silicon front surface to the glass wafer and removal of the handle or silicon wafer, the etch reaches through the bottom of a trench, and remaining film thickness may be determined by running a mechanical stylus over the edge of the trench.

It has thus been shown that the present invention provides a method by which a thin silicon layer or film can be deposited on an inexpensive insulator (glass) layer, while subsequent dopant incorporation and activation may be performed using laser doping, without the need to expose the glass to long high temperature cycles. Also, the invention utilizes laser scanning for producing a smooth surface on the silicon layer.

While particular embodiments, operational sequences, materials, etchants, etc. have been described or illustrated to set forth the principles of the invention, such are not intended to limit the invention to that described or illustrated. Modifications and changes will become apparent to those skilled in the art, and it is intended that the scope of the invention be limited only by the scope of the appended claims.

I claim:

1. A method for depositing a layer of silicon on an insulator material, comprising:
   forming at least one layer of laser activated doped silicon on a silicon member;
   forming at least one layer of silicon on the doped silicon layer;
   bonding a layer of the thus formed silicon to an insulator member; and
   removing at least the silicon member.

2. The method of claim 1, additionally comprising:
   smoothing the surface of at least the silicon layer following removal of at least the silicon member.

3. The method of claim 1, wherein the laser actuated doped silicon layer defines an etch stop for the removal of the silicon member by an etchant.

4. The method of claim 1, additionally comprising: forming the insulator material from glass.

5. The method of claim 1, wherein the laser activated doped silicon layer is formed using a short wavelength laser.

6. The method of claim 5, additionally comprising smoothing the surface of the silicon layer following removal of the doped silicon layer.

7. The method of claim 6, wherein the smoothing of the silicon layer surface is carried out by melting the surface of the silicon layer by laser energy, whereby the surface is smoothed during recystallization of the melted surface of the silicon layer.

8. The method of claim 7, wherein an excimer laser is used for melting the surface of the silicon layer.

9. The method of claim 8, wherein the laser activated doped silicon layer is formed by boron doping of the surface of the silicon member using an excimer laser.

10. The method of claim 1, additionally comprising: forming the insulator material from glass, and boron doping a surface of the silicon member by an excimer laser to form a boron doped silicon layer.

11. The method of claim 10, additionally comprising forming a layer of silicon-germanium on the layer of silicon, and forming a layer of device quality silicon on the silicon-germanium layer.

12. The method of claim 1, wherein the layer of laser activated doped silicon comprises a first etch stop layer, and additionally including forming a second etch stop layer on the layer of silicon, and forming a layer of device quality silicon on the second etch stop layer.

13. The method of claim 12, wherein the second etch stop layer is selected from the group comprising an epitaxially grown layer of boron doped silicon, silicon-germanium, silicon-lead and silicon-tin.

14. The method of claim 13, additionally including removing the first formed layer of silicon following removal of the first etch stop layer, and removing the second etch stop layer following removal of the first formed layer of silicon leaving the layer of device quality silicon on the insulator member.

15. The method of claim 14, additionally including smoothing the surface of at least the layer of device quality silicon by the surface melting with an excimer laser.

16. A method for producing glass members having a thin film of silicon deposited thereon, comprising:
forming layers of doped silicon and silicon on a silicon member; securing the layer of silicon to a glass member; and
removing the silicon member and the layer of doped silicon from the layer of silicon secured to the glass member, wherein the forming of the doped silicon is carried out using a short wavelength laser and directing pulsed laser energy onto the surface of the silicon member in an environment which includes a dopant.

17. The method of claim 16, wherein the short wavelength laser constitutes an excimer laser, and wherein the dopant environment contains boron.

18. The method of claim 16, additionally including depositing a layer of dielectric material on an outer of the alternate layers formed on the silicon member, and securing the layer of dielectric material on the glass member.

19. The method of claim 18, additionally including depositing a metal layer on the dielectric layer, and etching selected patterns in at least the metal and dielectric layers.

20. The method of claim 16, additionally comprising smoothing the surface of the silicon layer secured to the glass member.

21. The method of claim 20, wherein the surface smoothing of the silicon layer is carried out by scanning an excimer laser across the surface causing melting of the surface, and allowing the melted surface to recrystallize.

22. The method of claim 16, wherein at least two layers of doped silicon and at least two layers of silicon are formed on the silicon member, such that a first of said layers of doped silicon is formed directly on the silicon member.

23. The method of claim 22, wherein at least one of said two layers of doped silicon is formed using a short wavelength laser in a dopant environment.

24. method for depositing a layer of silicon on an insulator material, comprising:
forming a first etch stop layer on a surface of a silicon member;
forming a first silicon layer on the first etch stop layer;
forming a second etch stop layer on the first silicon layer;
forming a second silicon layer on the second etch stop layer;
anodic bonding the second silicon layer to an insulator material; and
removing the silicon member, the etch stop layers, and the first silicon layer.

25. The method of claim 24, additionally including smoothing at least the second silicon layer following removal of the second etch stop layer.

26. The method of claim 24, wherein at least one of said etch stop layers is formed from the group consisting of an epitaxially grown boron doped silicon, silicon-germanium, silicon-lead and silicon-tin.

27. The method of claim 24, additionally including forming at least one trench in the second silicon layer for determining the thickness of the silicon layer bonded to the insulator member.

* * * * *